(12) United States Patent
Drasny et al.

(10) Patent No.: US 7,823,097 B2
(45) Date of Patent: Oct. 26, 2010

(54) UNROLLING HARDWARE DESIGN GENERATE STATEMENTS IN A SOURCE WINDOW DEBUGGER

(75) Inventors: Gabor Drasny, Poughkeepsie, NY (US); Gabor Bobok, Schenectady, NY (US); Ali El-Zein, Austin, TX (US); Fadi Zaraket, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 11/532,216

(22) Filed: Sep. 15, 2006

(65) Prior Publication Data
US 2008/0072206 A1    Mar. 20, 2008

(51) Int. Cl.
    *G06F 17/50*    (2006.01)
(52) U.S. Cl. .................................. 716/4; 716/5; 716/18
(58) Field of Classification Search ...................... 716/1, 716/4, 5, 18; 717/150, 160
    See application file for complete search history.

(56) References Cited

U.S. PATENT DOCUMENTS

| 6,594,802 | B1 | 7/2003 | Ricchetti et al. ................ 716/4 |
| 6,817,007 | B2* | 11/2004 | Burnette et al. ................ 716/18 |
| 6,823,497 | B2 | 11/2004 | Schubert et al. ................ 716/4 |
| 6,874,140 | B1 | 3/2005 | Shupak ........................ 717/131 |
| 2004/0015915 | A1* | 1/2004 | Lam et al. .................... 717/150 |
| 2004/0163072 | A1* | 8/2004 | Levy ........................... 717/106 |
| 2007/0294651 | A1* | 12/2007 | Tsai et al. ...................... 716/5 |

OTHER PUBLICATIONS

Fallah et al., "Functional Vector Generation for Sequential HDL Models Under an Observability-Based Code Coverage Metric," IEEE, Jan 7, 2002, pp. 919-923.*

Yu-Chin Hsu, Bassam Tabbarra, Yirng-An Chen, Furshing Tsai, Advanced techniques for RTL Debugging, DAC 2003, Jun. 2-6, 2003.

* cited by examiner

*Primary Examiner*—Vuthe Siek
(74) *Attorney, Agent, or Firm*—John E. Campbell; Ido Tuchman

(57) ABSTRACT

Unrolling the "generate" statement of a hardware description language ("HDL") and displaying the unrolled HDL. For a conditional generate the condition is evaluated. If the statement is true the enclosed HDL code will be displayed. For an iterative generate, the enclosing HDL will be displayed as many times as specified by the bounds of the iteration scheme. This allows, for example, simulation value annotations for signals declared inside the generate statement, semantic navigation inside the generate statements, and allows the user to visualize what is included in the target design.

18 Claims, 2 Drawing Sheets

UNROLLING HARDWARE DESIGN GENERATE STATEMENTS IN A SOURCE WINDOW DEBUGGER

BACKGROUND

1. Field of the Invention

The invention relates to transforming a high-level design (including functional specifications and functional-level logic such as Boolean expressions, truth tables, and standard macro logic) into hardware implementations, including methods and steps for determining the interconnections and path nets between circuit blocks, circuit components and input/output bonding pads (pins), and the outlining of layout of circuit components, as well as determining and evaluating the performance of the designed circuit components.

2. Background Art

The state-of-the-art in hardware design is to utilize a hardware description language (HDL), such as VHDL or Verilog. To help in debugging, electronic design automation tool vendors provide HDL source browsers that possess a variety of functionalities, such as:

1. Simulation value annotation: where signal values obtained from a simulation database are annotated back to the HDL source.
2. Syntax highlight: where different token types (keywords, comments, identifiers, etc) are highlighted in different colors, fonts, or the like.
3. Semantic navigation: where from a signal usage jump to its declaration or its type declaration, all sources and sinks of the signal are listed, from a VHDL entity jump to its architecture, etc.

VHDL and Verilog grammars also have a "generate" statement. A generate statement can be either conditional (if-generate, case-generate) or iterative (for generate). A conditional generate statement will use a condition to decide whether the enclosed HDL statements will be included in the target design or not. In an iterative generate statement the enclosed statements will be included multiple times depending on the iteration bounds.

Current HDL Source browsers have limited support for dealing with generate statements due to
1. the complexity of evaluating the generate condition or iteration,
2. determining out how to annotate values for signals declared inside the generate statement (multiple copies), and
3. semantic navigation of the design entities declared inside the statements.

Thus, a need exists enabling value annotation and semantic navigation for generate statements through unrolling them.

SUMMARY OF INVENTION

In this disclosure, we provide a method, system, and program product for unrolling the "generate" statement and displaying the unrolled HDL. For a conditional generate, the condition is evaluated. If the condition is true, then the enclosed HDL code will be displayed. For an iterative generate, the enclosing HDL will be displayed as many times as specified by the bounds of the iteration scheme. The advantages of this approach are that it facilitates:
1. simulation value annotation for signals declared inside the generate statements,
2. semantic navigation inside the generate statements, and
3. visualization of what is included in the target design.

The cumulative effect is to improve HDL debugging capabilities and replace the iterator with its value in every iteration allowing more precise value annotation and navigation.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
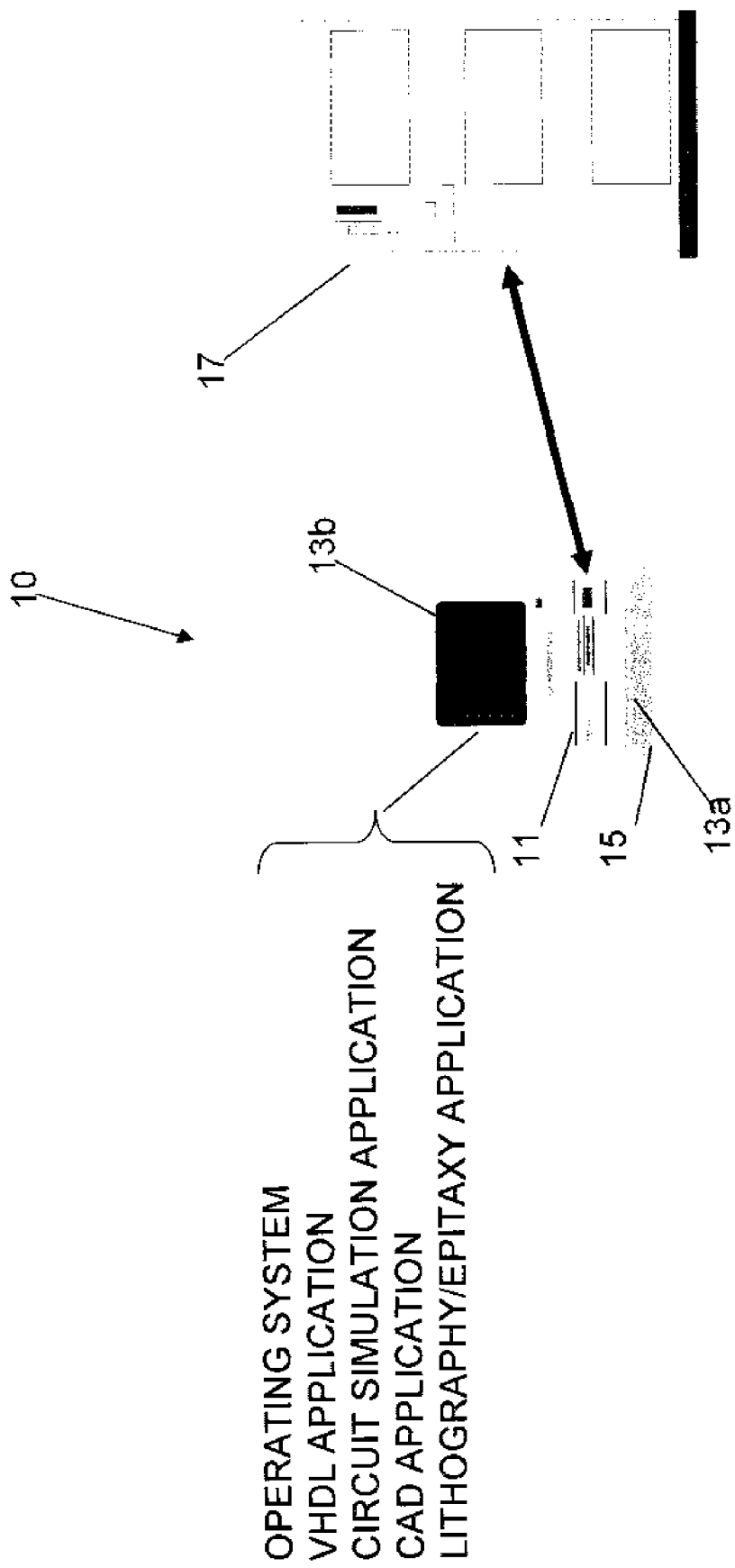
FIG. 1 is a high level representation of an automated electronic design automation work station with a central processing unit, input/output, volatile and non-volatile memory, and capable of running electronic design automation software tools, either from programs in local memory or networked memory.

The disclosed invention provides the capability of unrolling the "generate" statement and displaying the unrolled HDL generated thereby. For a conditional generate, the condition of the "generate" statement is evaluated. If it is true, then the enclosed HDL code will be displayed. For an iterative generate, the enclosing HDL will be displayed as many times as specified by the bounds of the iteration scheme.

Using the invention described herein, unrolling the "generate" statement of a hardware description language ("HDL") program displays the unrolled HDL. For a conditional generate unrolling causes the condition to he evaluated. If the statement is true the enclosed HDL code will be displayed.

For an iterative generate, the enclosing HDL will be displayed as many times as specified by the bounds of the iteration scheme. This allows, for example, simulation value annotations for signals declared inside the generate statement, semantic navigation inside the generate statements, and allows the user to visualize what is included in the target design.

VHDL is used herein as an example to describe the invention. Consider the following VHDL code:

```
library ieee;
use ieee.std_logic_1164.all;
entity e1 is
    port (i1, i2: in std_ulogic;
          o1: out std_ulogic);
end;
architecture e1 of e1 is
begin
    o1 <= i1 or i2;
end;
library ieee;
use ieee.std_logic_1164.all;
entity gen1 is
    generic(g1: integer := 2);
    port (i1, i2: in std_ulogic_vector(0 to 10);
          o1,o2 : out std_ulogic_vector(0 to 10);
          o3: out std_ulogic);
end;
architecture gen1 of gen1 is
function myf(a: integer) return integer is
    variable result: integer := 0;
begin
    result := 0;
    for i in 0 to a loop
```

-continued

```
        result := result+i*i;
    end loop;
    return result;
end;
begin
    l1: for i in 0 to myf(g1) generate
        signal x: std_ulogic;
        signal y: std_ulogic;
        begin
            x <= i1(i) xor i2(i);
            y <= i1(i) xnor i2(i);
            o1(i) <= x;
            o2(i) <= y;
            l2: if i = 2 generate
                l3: entity work.e1 port map(x,y,o3);
            end generate;
        end generate;
end;
```

In the above VHDL example, there are two modules: gen1 and e1. Module gen1 has two VHDL generate statements: a for-generate and an if-generate. There are two signals declared inside the for-generate, meaning that for every value of the loop iterator two different signals will be created. The if-generate statement decides whether to instantiate the module e1 or not inside gen1. Note that its condition is dependent on the loop iterator. Running a current vendor source browser on the code above displays the generate statements in a way that looks like this:

```
l1: for i in 0 to myf(g1) generate
    signal x: std_ulogic;
    signal y: std_ulogic;
begin
    x <= i1(i) xor i2(i);
    y <= i(1) xnor i2(i);
    01(i) <= x;
    02(i) <= y;
    l2:: if i = 2 or i=3 generate
        l3: entity work e1 port map (x, y, o3(i));
    end generate;
end generate;
```

Notice the following:

The signals x and y are not annotated. For every loop iterator there are different x and y signals.

All semantic navigation is disabled for all declarations inside the generate statements due to the existence of multiple copies. In the example above there are three declarative items inside the for-generate: x, y and l3. For l3, which is a label for an instantiation statement, the user will not he able to jump to the instance. The instance can be either the one corresponding to i=2 or i=3.

In this disclosure we avoid the above limitations by unrolling the generate statements as follows:

1. The user clicks on the label l1 of the generate statement and ask to unroll the loop.
2. Next, the bounds of the loop are evaluated. The difficulty is that the bounds can be dependent on function calls, like in the example above. Thus, it is necessary to evaluate myf (g1) In our case, we synthesize the function, myf, into gates and do constant propagation to get the bounds. This results in the bounds 0 and 5 for the l1 for-generate.
3. Next, we reparse the generate body several times, e.g., six times, displaying the unrolled HDL code in a separate pop-up window. For every iteration the unrolled code is embedded inside a VHDL block whose name is dependent on the generate label and the iteration value, as defined by the VHDL language.
4. The value of the iterator is substituted by its value in every iteration.
5. The value annotation and semantic navigation are enabled inside the unrolled code.

Figure 2:
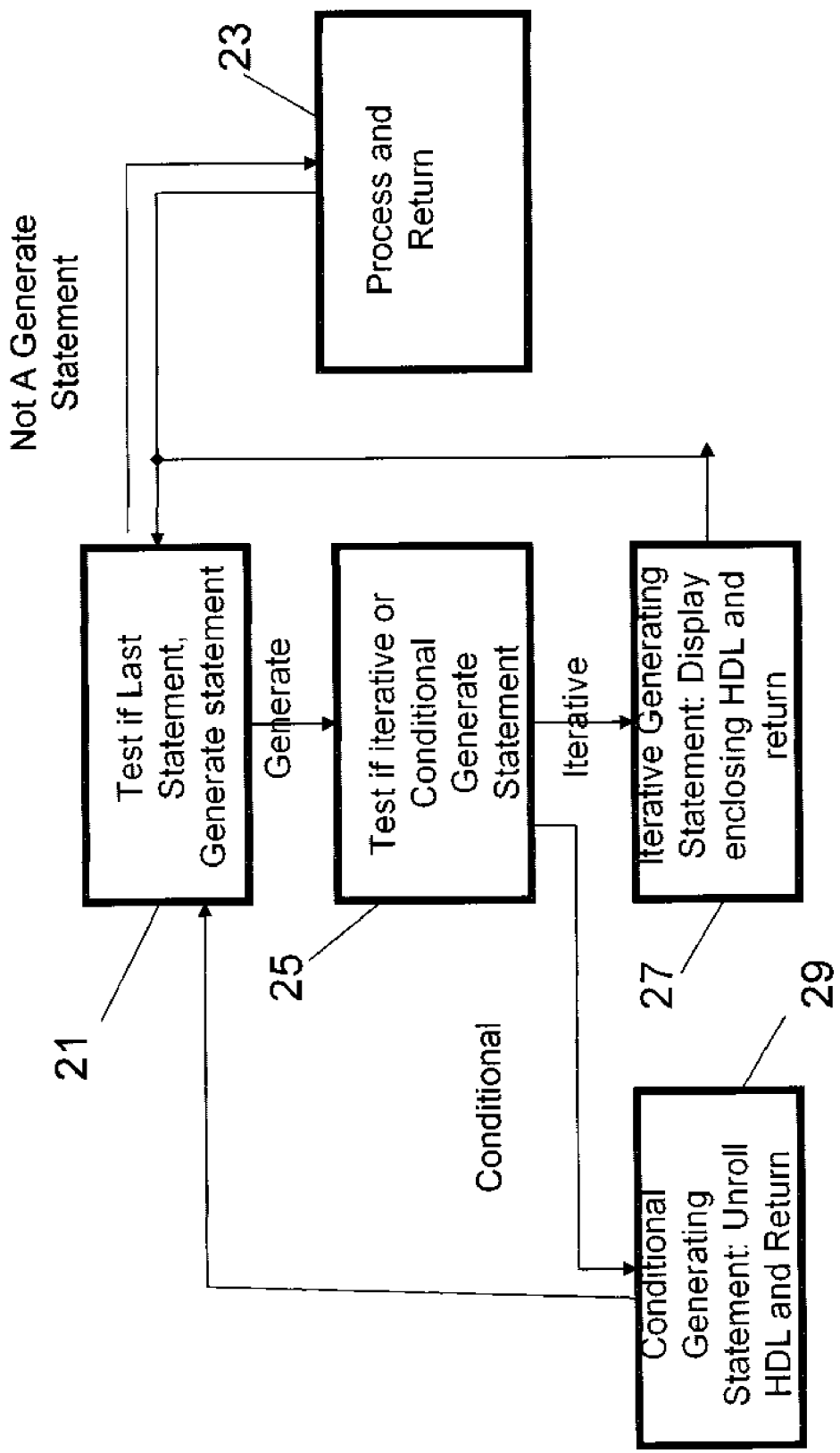
FIG. 2 is a high level representation of a flow of the method of the disclosed invention.

This is illustrated in the flow chart of FIG. 2. As there shown, FIG. 2 illustrates a high level flow chart of the method, system, and program product of the invention. The method starts by parsing the HDL code in step 21 to determine if the particular block of code is the last block, or if it is a "Generate" statement. If it is the last block of code the program exits, and if it is not a generate statement, it is processed accordingly 23.

If the block is determined to be a "Generate" statement, it is parsed to see if it is iterative or conditional in step 25. If it is an iterative generating statement the enclosing code is displayed 27, and control is returned 21. If the generating statement is conditional 29 the HDL is unrolled and control is then returned 21.

The capabilities of the present invention can be implemented in hardware. That is, as shown in FIG. 1, by a computer or work station 10 with a central processing unit 11, input/output 13a and 13b, volatile local memory 15 and non-volatile memory 17, either networked or local, and capable of running electronic design automation software tools, either from programs in local memory 15 or networked memory 17. The electronic design automation software typically includes a VHDL or Verilog program, a circuit design and simulation program, and a CAD software package, possibly with epitaxy and photoresist layout capability.

Additionally, the invention or various implementations of it may be implemented in software. When implemented in software, at least one program storage device readable by a machine, tangibly embodying at least one program of instructions executable by the machine to perform the capabilities of the present invention can be provided to carry the program code.

The invention may be implemented, for example, by having the system for unrolling the generate statement and displaying the unrolled HDL executing the method as a software application, in a dedicated processor or set of processors, or in a dedicated processor or dedicated processors with dedicated code The code executes a sequence of machine-readable instructions, which can also be referred to as code. These instructions may reside in various types of signal-bearing media. In this respect, one aspect of the present invention concerns a program product, comprising a signal-bearing medium or signal-bearing media tangibly embodying a program of machine-readable instructions executable by a digital processing apparatus to perform a method for by having the system for unrolling the HDL code, executing the method as a software application.

The signal-bearing medium may comprise, for example, memory in a server. The memory in the server may be non-volatile storage, a data disc, or even memory on a vendor server for downloading to a processor for installation. Alternatively, the instructions may be embodied in a signal-bearing medium such as the optical data storage disc. Alternatively, the instructions may be stored on any of a variety of machine-readable data storage mediums or media, which may include, for example, a "hard drive", a RAID array, a RAMAC, a magnetic data storage diskette (such as a floppy disk), magnetic tape, digital optical tape, RAM, ROM, EPROM, EEPROM, flash memory, magneto-optical storage, paper punch cards, or any other suitable signal-bearing media including transmission media such as digital and/or analog communications links, which may be electrical, optical, and/or wireless. As an example, the machine-readable instructions may comprise software object code, compiled from a language such as "C++", Java, Pascal, ADA, assembler, and the like.

Additionally, the program code may, for example, be compressed, encrypted, or both, and may include executable code, script code and wizards for installation, as in Zip code and cab code. As used herein the term machine-readable instructions or code residing in or on signal-bearing media include all of the above means of delivery.

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

We claim:

1. A method comprising:
   displaying a hardware description language ("HDL") program, the HDL program representing circuitry embodied in hardware;
   receiving indication to unroll a generate statement in the HDL program;
   unrolling the generate statement of the HDL program into an unrolled HDL code; and
   if the generate statement is a conditional generate, evaluating a condition at the conditional generate and displaying the unrolled HDL code if the condition is true; and
   if the generate statement is an iterative generate statement, evaluating bounds of an iteration scheme for the generate statement and displaying the unrolled HDL code as many times as specified by the bounds of the iteration scheme.

2. The method of claim 1 comprising for an iterative generate, displaying enclosing HDL as many times as specified by the bounds of the iteration scheme.

3. The method of claim 2 comprising simulating value annotations for signals declared inside the generate statement.

4. The method of claim 3 comprising semantically navigating inside generate statements.

5. The method of claim 2 comprising visualizing a targeted design.

6. The method of claim 1 comprising:
   when the iterative generate statement is unrolled, simulating value annotations for signals declared inside the generate statement, semantically navigating inside generate statements, and visualizing a targeted design.

7. An electronic design automation work station comprising:
   a central processor unit, volatile memory, non-volatile memory, input-output, and computer readable hardware design language software with code therein for unrolling a generate statement of a hardware description language ("HDL") program and displaying the unrolled generate statement, where when a conditional generate is unrolled the condition is evaluated, and if the generate statement is true the unrolled generate statement is displayed.

8. The electronic design automation work station of claim 7 comprising said computer code, displaying enclosing HDL as many times as specified by the bounds of the iteration scheme for an iterative generate.

9. The electronic design automation work station of claim 8 comprising computer code for simulating value annotations for signals declared inside the generate statement.

10. The electronic design automation work station of claim 9 comprising computer code for semantically navigating inside generate statements.

11. The electronic design automation work station of claim 8 comprising computer code for visualizing a targeted design.

12. The electronic design automation work station of claim 7 comprising computer code for unrolling a generate statement of a hardware description language ("HDL") and displaying the unrolled HDL,
   a. where when a conditional generate is unrolled the condition is evaluated, and if the statement is true the enclosed HDL code is displayed, and
   b. when an iterative generate in unrolled, displaying enclosing HDL as many times as specified by the bounds of the iteration scheme, simulating value annotations for signals declared inside the generate statement, semantically navigating inside generate statements, and visualizing a targeted design.

13. A computer program product comprising a computer readable memory having computer readable code thereon for configuring and control a computer to perform electronic design automation with code therein for:
   unrolling a generate statement of a hardware description language ("HDL") program; and
   displaying the unrolled generate statement, where when a conditional generate is unrolled the condition is evaluated, and if the statement is true the unrolled generate statement is displayed.

14. The computer program product of claim 13 comprising said computer code adapted for displaying enclosing HDL as many times as specified by the bounds of the iteration scheme for an iterative generate.

15. The computer program product of claim 14 comprising computer code adapted for simulating value annotations for signals declared inside the generate statement.

16. The computer program product of claim 15 comprising computer code adapted for semantically navigating inside generate statements.

17. The computer program product of claim 14 comprising computer code adapted for visualizing a targeted design.

18. The computer program product of claim 13 comprising computer code adapted for unrolling a generate statement of a hardware description language ("HDL") and displaying the unrolled HDL,
   a. where when a conditional generate is unrolled the condition is evaluated, and if the statement is true the enclosed HDL code is displayed, and
   b. when an iterative generate in unrolled, displaying enclosing HDL as many times as specified by the bounds of the iteration scheme, simulating value annotations for signals declared inside the generate statement, semantically navigating inside generate statements, and visualizing a targeted design.

* * * * *